United States Patent [19]
Warren, Jr. et al.

[11] Patent Number: 5,864,776
[45] Date of Patent: Jan. 26, 1999

[54] APPARATUS AND METHOD FOR DETECTING AN ERROR IN THE PLACEMENT OF A LEAD FRAME ON A SURFACE OF A DIE MOLD

[75] Inventors: Waite R. Warren, Jr., Raleigh; John T. Cox, Durham, both of N.C.; Louis W. Nicholls, Gilbert, Ariz.

[73] Assignee: Mitsubishi Electric America, Inc., Cypress, Calif.

[21] Appl. No.: 917,917

[22] Filed: Aug. 27, 1997

[51] Int. Cl.⁶ .................................................. G01J 5/00
[52] U.S. Cl. ................... 702/135; 702/99; 374/9; 374/124; 374/126
[58] Field of Search .................... 364/557, 581, 364/490; 374/45, 107, 112, 124–128, 130, 131, 141, 9; 250/338.1, 551; 702/99, 130, 135

[56] References Cited

U.S. PATENT DOCUMENTS

| | | | |
|---|---|---|---|
| Re. 34,507 | 1/1994 | Egawa et al. | 374/126 |
| 3,867,697 | 2/1975 | Vanzetti et al. | 324/752 |
| 4,481,418 | 11/1984 | Vanzetti et al. | |
| 4,696,104 | 9/1987 | Vanzetti et al. | |
| 4,722,060 | 1/1988 | Quin et al. | 364/490 |
| 4,755,474 | 7/1988 | Moyer | 250/551 |
| 4,792,683 | 12/1988 | Chang et al. | |
| 4,881,823 | 11/1989 | Tanaka et al. | 374/9 |
| 4,919,542 | 4/1990 | Nulman et al. | |
| 4,973,948 | 11/1990 | Roberts . | |
| 5,024,533 | 6/1991 | Egawa et al. | 374/126 |
| 5,102,231 | 4/1992 | Loewenstein et al. | |
| 5,165,791 | 11/1992 | Miki et al. | |
| 5,186,541 | 2/1993 | Paulk . | |
| 5,246,291 | 9/1993 | Lebeau et al. | |
| 5,436,172 | 7/1995 | Moslehi . | |
| 5,501,637 | 3/1996 | Duncan et al. | |
| 5,563,441 | 10/1996 | Kato | 257/666 |

*Primary Examiner*—John Barlow
*Assistant Examiner*—Brian Bui
*Attorney, Agent, or Firm*—McDermott, Will & Emery

[57] ABSTRACT

A position detection system is provided which, without physical contact, by the use of detected infrared energy emissions determines whether there is correct placement of one or more small objects, e.g., lead frames, on the lower half of a two-part die mold in a semiconductor component manufacturing process. This takes place prior to injection of an initially molten material that solidifies and encapsulates the small objects upon curing and cooling.

22 Claims, 7 Drawing Sheets

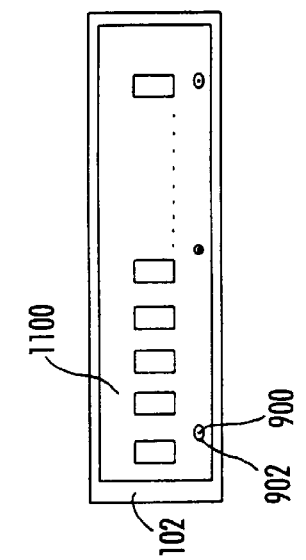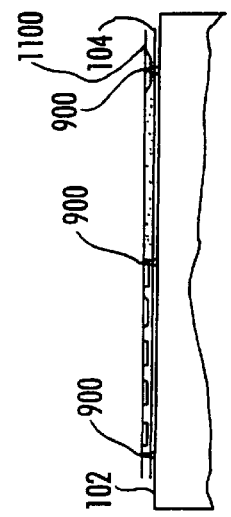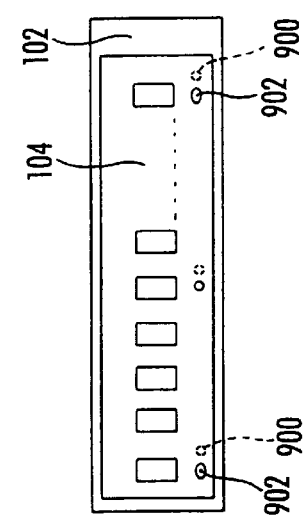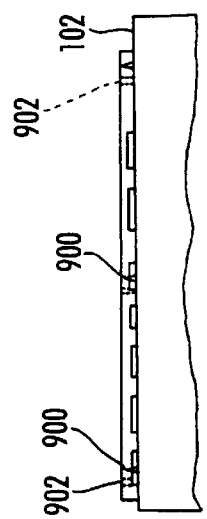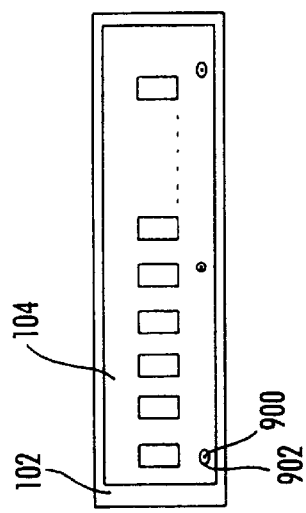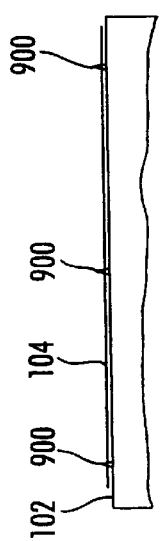

ent temperature, and more particularly to determining whether a lead frame has been correctly located on a surface of a lower die mold which is at an initially higher temperature.

APPARATUS AND METHOD FOR DETECTING AN ERROR IN THE PLACEMENT OF A LEAD FRAME ON A SURFACE OF A DIE MOLD

TECHNICAL FIELD OF THE INVENTION

This invention relates to apparatus and a method for determining whether an object has been correctly placed on a larger object initially at a different temperature, and more particularly to determining whether a lead frame has been correctly located on a surface of a lower die mold which is at an initially higher temperature.

BACKGROUND OF THE RELATED ART

Manufacturing processes often include steps in which one or more relatively small objects must be correctly positioned on a relatively larger object, e.g., to thermally mold a coating material onto the smaller elements. Many conventional molding systems employ two cooperating die molds which are formed to have respective recesses that define around the small elements corresponding spaces into which molten encapsulating material is caused to flow under pressure for the desired encapsulation. The encapsulating material typically is a resinous material which flows at a heated temperature and becomes solid when cooled.

Incorrect positioning of the small elements which are to be encapsulated can easily obstruct adequate clamping of the die molds to each other and may consequently allow the molten material, in its pressurized and molten state, to flow in an uncontrolled manner across and between the cooperating die molds. A known term for this kind of problem, where a resinous material is to be molded, is "resin spread". The problem is particularly acute where a number of small elements, e.g., lead frames onto which electronic components have been formed, are to be placed on a lower die mold at precise locations.

In high-speed automated molding systems, errors can occur not only when individual lead frames are incorrectly positioned but sometimes also due to inadvertent disposition of one lead frame above another lead frame. Whatever the reason, when "resin spread" occurs as a consequence, at least four wire-bonded lead frames are typically lost from production. Even worse, the molding system may have to be shut down, often for four hours or longer, to permit sufficient cooling thereof to allow workers to clean the die surfaces exposed to the resin spread. In more extreme circumstances, e.g., where the mislocation of a lead frame is severe or one lead frame is placed over or in an overlapping relationship relative to another lead frame, there may even be actual physical damage to one or both of the cooperating die molds.

It is generally difficult to detect the presence of a lead frame on a typical die surface for various reasons. Both are made of metal, and hence a device that utilizes magnetism, e.g., an eddy sensor, cannot work satisfactorily to distinguish between a lead frame and the mold die. Furthermore, both the lead frame and the die mold surface on which the lead frame typically rests have similar reflectivities, hence devices such as cameras which utilize light in the visible spectrum cannot operate to distinguish between a lead frame and a die mold.

Other factors which must be considered include the fact that any sensors which are to be employed must be mounted on the inloader head of the apparatus and must be capable of operating while being subjected to relatively stressful repetitive movement. In addition, the environment is one in which the temperature typically is 180° C. above and below the inloader head, which is hazardous for human beings and inimical to many electronics components. Also, rapid detection of correct placement of the lead frame on the die mold is required so that the cycle time, i.e., time between successive molding operations, is not unduly prolonged.

These requirements of reliability, durability, tolerance of high temperatures, and speed in making the necessary determinations, all pose significant challenges. The present invention provides a satisfactory solution at very moderate cost and without the need for complex, fragile, or unduly sensitive components.

Various types of known manufacturing processes also require correct placement, location, or formation of elements for successful production of final products which physically include the elements.

U.S. Pat. No. 5,186,541, to Paulk, titled "Non-Contact Infrared Temperature Sensing System", teaches a non-contact infrared temperature sensing system which employs an infrared detector and compares the emissivity of a target to an inputted value to determine the temperature of the target.

U.S. Pat. No. 5,165,791, to Miki et al, titled "Method and Apparatus for Measuring Temperature Based on Infrared Light", discloses a method and apparatus for utilizing infrared light to measure the temperature of a semiconductor formed with a surface layer consisting of two kinds of materials which have different emissivities and optical reflectances. The disclosed method involves the taking of an image with diffused light reflected from the surface of the semiconductor element and of determining an area ratio in which each of the two kinds of materials occupy the surface of the semiconductor element by comparing relative average brightness values.

U.S. Pat. No. 4,973,948, to Roberts, titled "Reversed or Missing Lead Frame Detector", teaches the use of a sensing means to determine the presence or absence of a unique aperture by completing or closing an electrical circuit to generate an indication or an alarm if a problem exists. The disclosed system employs a steel reflector pin engaging a corresponding aperture in the lead frame to open or close a circuit. When the circuit resistance is not within an expected range of resistance values, dependent on the total number of lead frames being tested, the user will receive a corresponding signal.

U.S. Pat. No. 4,481,418, to Vanzetti et al, titled "Fiber Optic Scanning System for Laser/Thermal Inspection", discloses the use of a plurality of different infrared radiating elements including an optical head movable in two dimensions above a fixed device to sequentially scan the plurality of infrared radiating elements. The system employs a laser beam source connected to a movable head for projecting thermal energy onto the infrared radiating elements.

None of these references is considered capable of providing either an apparatus or a method for quickly and accurately determining whether there is correct placement of one or more lead frames on a die mold which initially may be at an elevated temperature, e.g., 180° C. There is clearly a need for a sturdy, simple and reliable apparatus and a corresponding method for solving this problem.

The present invention, as described more fully hereinbelow with reference to the accompanying figures, is intended to provide an effective solution.

SUMMARY OF THE INVENTION

Accordingly, it is an object of this invention to provide apparatus with which a user may very quickly and with a high degree of assurance determine whether there is correct placement of at least one relatively small element on a relatively larger element, without having to make physical contact with either the small or the larger element.

Another object of this invention is to provide an apparatus which is sturdy, inexpensive, and reliable in operation, to quickly determine whether there is correct simultaneous placement of one or more relatively small elements one at each of a corresponding number of specific locations provided therefor on a lower die mold of a multi-part molding system.

It is yet another object of this invention to provide apparatus for alerting an operator to incorrect disposition of any of a plurality of lead frames each at a predetermined location therefor on an upper surface of a heated die mold prior to the application of an encapsulating initially molten material under pressure.

It is a related further object of this invention to provide a method by which a user may quickly and with a high degree of confidence determine whether there are errors in the placement of at least one relatively small element on another element which is initially at a different temperature.

It is yet another object of this aspect of the invention to provide a method alerting an operator whenever there is incorrect placement of a plurality of lead frames, each at a corresponding specific location, on an upper surface of a lower die mold.

Accordingly, in the preferred embodiment of the apparatus according to this invention, there is provided a method of determining whether a first element is located in a predetermined position in contact with a second element which is initially at a different temperature. The method includes the steps of processing a first infrared energy emission from the first element into a first signal corresponding to a temperature of the first element and processing a second infrared energy emission from the second element into a second signal corresponding to a temperature of the second element. The first and second signals are processed to determine therefrom a first value of a time rate of change of a temperature difference between the first and second elements. The determined first value is compared to a predetermined second value indicative of correct location of the first element, to thereby decide whether the first element is located in said predetermined position.

In another aspect of this invention, there is provided an apparatus for detecting a predetermined disposition of at least one lead frame on a die mold surface. The preferred embodiment includes a plurality of fiber optic probes for detecting respective infrared energy emissions from the at least one lead frame and the die mold. An interference filter cooperates with the fiber optic probes to quantify all of the detected infrared energy emissions at a specific wavelength. An infrared detector receives the quantified detected infrared energy emissions from the interference filter to generate an output indicating whether the at least one lead frame is in the predetermined disposition on the die mold surface.

These and other related aspects of the invention will be understood from the following detailed description with reference to the accompanying figures.

BRIEF DESCRIPTION OF THE DRAWING

FIGS. 9(A) and 9(B) are plan and side views, respectively, of an exemplary lead frame correctly located with respect to location-determining pins provided on a lower die mold all correctly received into the lead frame.

FIGS. 10(A) and 10(B) are plan and side views, respectively, of an exemplary lead frame which is displaced relative to its intended location and is therefore resting on top of location-determining pins.

FIGS. 11(A) and 11(B) are plan and side views, respectively, of a second lead frame inadvertently placed above a correctly placed lead frame on a lower die mold.

DETAILED DESCRIPTION OF THE PREFERRED EMBODIMENTS

Figure 1:
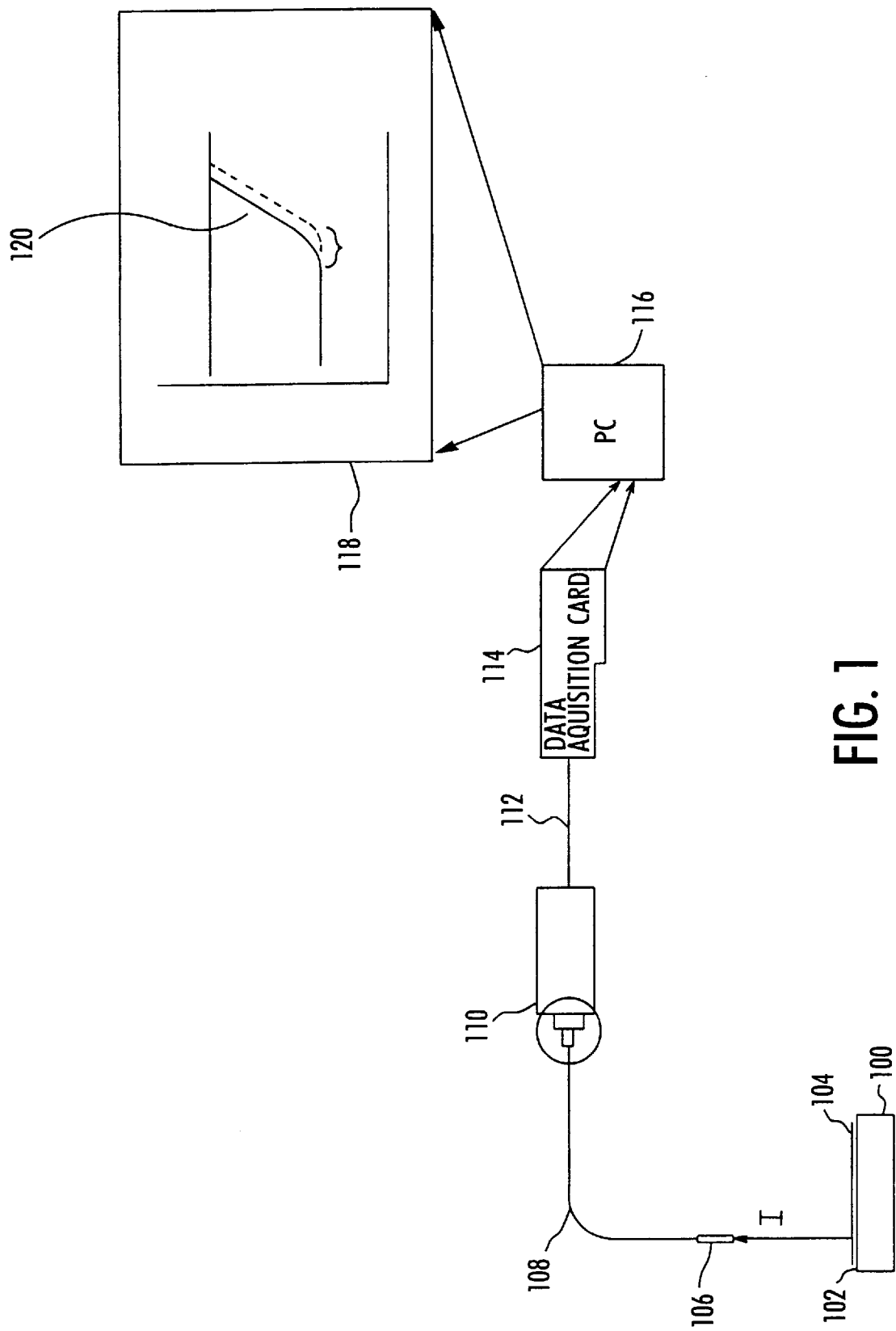
FIG. 1 is a schematic of the arrangement of the principal elements according to a preferred embodiment of this invention.
Figure 3:
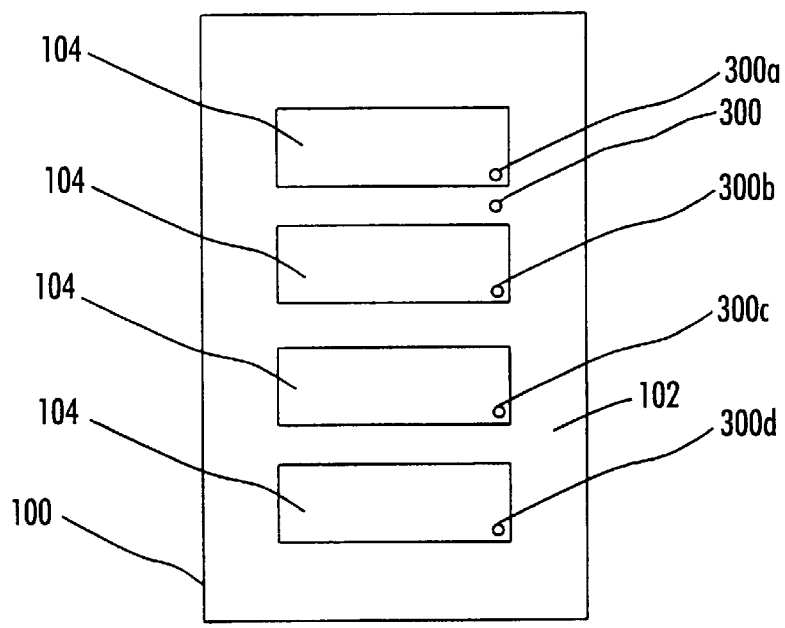
FIG. 3 is a schematic plan view of an exemplary lower die mold upon which are disposed a plurality of smaller lead frames, and also shows suitable locations for fiber optic probes on the die mold and various element surfaces according to the preferred embodiment.

As best seen in schematic view in FIG. 1, a lower die mold 100 has an upper surface 102 which is shown plane solely for simplicity. In actuality it will have a plurality of recesses within which respective lead frames may be placed for encapsulation. Thus, the typical lead frame 104 rests in contact with a portion of the upper surface 102 of lower die mold 100 after placement thereon by any conventional equipment which typically includes an inloader head (not shown) or its functional equivalent. In other words, various other conventional components typically would be present in the manufacturing facility, some of which serve the express purpose of delivering one or more lead frames for placement at specific locations on the lower die mold 100, as best seen in FIG. 3 in which four lead frames are shown placed in a selected array.

Referring still to FIG. 1, it should be appreciated that if lower die mold 100 is at a particular die-mold temperature "$T_m$" it will radiate energy in the form of infrared radiation which can be detected by a known conventional infrared detector. Similarly, if a lead frame at a different, typically lower, initial temperature "$T_i$" is placed in physical contact with upper surface 102, it too will radiate an infrared energy emission at a rate corresponding to its own time-varying temperature "$T_i$". If lead frame 104 was initially at a lower temperature than the temperature of the die mold 100 upon which it is placed, there will be conductive heat transfer between them and lead frame 104 will become heated while generating infrared energy emission at a rate which varies with time. Since the typical lead frame has a relatively small thermal mass compared to that of a typical lower die mold, the placement of even a plurality of such lead frames 104 on a lower die mold 100 probably will not cause a significant change in the temperature (and thus of the corresponding infrared emission) from the die mold. In contrast, each of the lead frames 104 upon becoming heated by the lower die mold 100 will show a time rate of change of temperature and corresponding infrared energy emissions.

The present invention operates by the use of apparatus and a method in which non-contacting detection of the infrared energy emissions from the lower die mold 100 and one or more lead frames 104, after proper processing, quickly and reliably establishes whether the one or more lead frames can be considered properly placed as intended on surface 102.

In FIG. 1, arrow "I" is intended to be an exemplary infrared energy emission either from a portion of upper surface 102 not actually covered by a lead frame 104 or, in the alternative, from an upper surface of a lead frame 104 placed on a portion of the surface 102. In other words, "I" is intended to represent only an exemplary infrared energy emission to be detected.

A conventional infrared energy emission detector 106 is positioned so as to receive infrared energy emission "I". Numerous such devices are commercially available and the manner of their selection and use likewise is well known, and will therefore not be discussed in detail.

Infrared energy emission detector 106 is conveniently coupled to a selected optic fiber 108 for detected infrared energy emission to be conveyed therethrough to a transducer system 110 for processing as described below. The combination of infrared energy emission detector element 106 and its corresponding optic fiber 108 may jointly be referred to as an "optic probe", and one such optic probe is employed to receive infrared energy emissions from a selected portion of upper surface 102 of lower die mold 100 and other emissions from selected portions of upper surfaces of lead frames 104. To protect the physical integrity of the various optic fibers it is usually most convenient to have them all pass through a suitable protective outer sheath in the form of a multifiber bundle. Optic fiber cables of this type are readily available commercially and one may be selected easily by persons of ordinary skill in the art for this invention.

Output signals from transducer 110 are conveyed via electrical wiring 112 to a data acquisition card 114 which may be made physically integral or be otherwise connected in conventional manner to a data processor, e.g., a personal computer 116. After appropriate processing in computer 116, a suitable audible/visible presentation of the processed data, together with any selected audio/visual warning signals or the like, may be generated in any conventional manner. FIG. 1 schematically shows what is intended to be a data screen of an audio/visual monitor 118 or the like which can display useful information in any selected form, e.g., as graphical plots 120 or the like.

Figure 2:
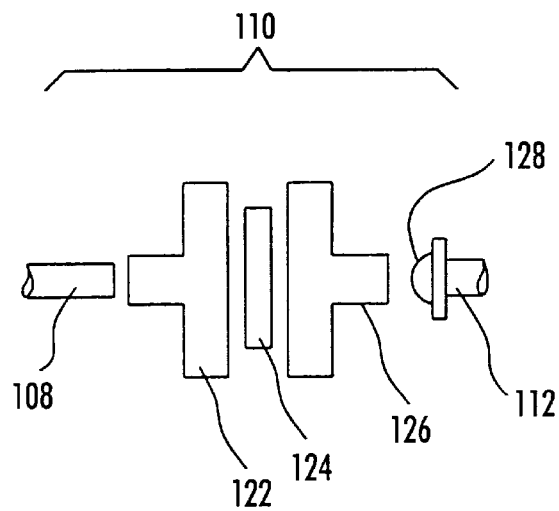
FIG. 2 is an enlarged, partially disassembled, view of the principal components of a fiber optic element for receiving an optical signal, filtering the same at a selected wavelength, and detecting the filtered signal for further processing according to the preferred embodiment.

FIG. 2 shows in exploded view certain key elements of transducer component 110. These are, starting from the left of FIG. 2, the distal end of optic fiber 108, a first optical head 122, interference filter 124, a second head 126, a silicon photodiode 128, and a distal end of an electrical wire 112 through which electrical output signals from photodiode 128 may be transmitted to data acquisition card 114. As will be appreciated, the elements illustrated in FIG. 2 are not intended to be drawn to scale. There will, of course, be an individual optic fiber 108 for each of the optic probes employed and first optical head 122 may have any suitable geometric form as needed to accommodate more than one optic fiber 108. The interference filter 124 must be selected to filter the infrared energy emissions all to a single selected wavelength, a preferred value being about 800 nm, although other values may be considered as appropriate. Second optical head 126, which cooperates with first optical head 122 to operatively hold interference filter 124 in place, may be readily selected from commercially available components of this type. The silicon photodiode 120 is considered particularly suitable for the high temperature and otherwise physically demanding environment although it need not necessarily be exposed to the typical 180° C. temperature of the die mold. Wire 112 is intended to be only exemplary and more than one wire may be utilized as needed, and a plurality of such wires may be encased within a common sheath.

FIG. 3 is a somewhat simplified plan view of a plurality of exemplary lead frames 104 disposed in a deliberately selected array on an upper surface 102 of a lower die mold 100. If one of the lead frames 104 is improperly positioned, it is displaced from its intended position, this would constitute an unacceptable or anomalous situation which the present invention must promptly detect. The occurrence of such a situation must be adequately conveyed to a responsible operator who may then take corrective action, e.g., reposition or remove the improperly located lead frame 104. It is also possible that due to imperfect operation of the inloader head (not shown for simplicity only) more than one lead frame may be unintentionally deposited at a single location on upper surface 102 of lower die mold 100. If this situation is not corrected, when the upper die mold (not shown) is sought to be put in operative contact with the lower die mold 100, the improperly disposed lead frames very likely would suffer physical damage and if one or the other or both of them were out of place then very likely one or both of the upper and lower die molds also would suffer physical damage. Even further, if the inloader head failed to deposit a lead frame at its intended location, inflow of the pressurized molten encapsulating material would result in a useless lump of cured encapsulation material without any lead frame contained therein. All of these anomalous and undesirable situations need to be detected.

Figure 4:
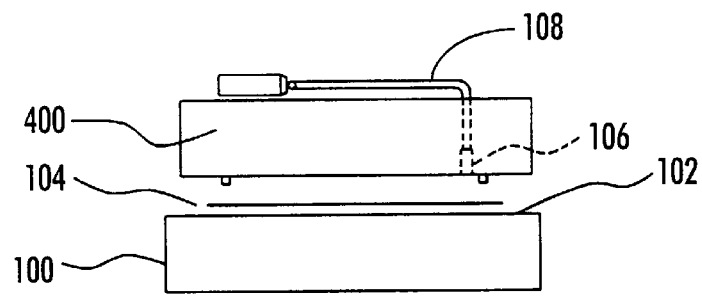
FIG. 4 is an end elevation view of the die mold and the plurality of small elements placed thereon per FIG. 3, as well as a cooperating fiber optic probe head assembly for projecting infrared energy an retrieving reflected signals via a plurality of fiber optic probes.

In FIG. 3 a suitably selected location 300 is chosen for receiving infrared energy emission from lower die mold 100 by a corresponding disposed optic probe 108 (not shown for simplicity). Likewise, a plurality of appropriate selected locations 302a, 302b, etc. are selected for the disposition thereat of respective infrared energy emissions receiving portions of corresponding optic probes intended to detect specific lead frames 104, 104. Locations 300a–300d, in the case of the four lead frames per the embodiment of FIG. 3, are such that the related optic probes will receive infrared energy emissions only from corresponding lead frames which are correctly or incorrectly located thereat. For convenience and sturdiness of the structure the infrared energy receiving distal end elements of the respective optic probes for detecting the lead frames are all mounted to the inloader head 400 as best seen in FIG. 4.

The exact spacing between inloader head 400 and lead frames 104, 104 and the lower die mold 100 therebelow is a matter of design choice and is not considered to be critical to successful operation of this invention. Persons of ordinary skill in the art who have access to the necessary dimensions of the other elements can readily determine such parameters. With the equipment described thus far, once the inloader head has deposited what should be the correct number of lead frames, each in its intended position, on upper surface 102 of lower die mold 100, infrared energy emissions from the lower die mold at location 300 as well as infrared energy emissions from each of the upper surfaces of lead frames 104, 104 will be detected at corresponding locations 300a–300d. Each of the thus detected infrared energy emissions will be conveyed through a corresponding optic fiber 108 to interference filter 124 in the transducer element 110 where it will be filtered at the selected frequency, e.g., 800 nm. The filtered infrared energy emissions will each then reach photodiode 128 which will generate corresponding electrical output signals conveyed via corresponding wiring 112 to data acquisition care 114 and, therefrom, to computer 116. The individual signals will of course be related to values of the corresponding temperatures at the various locations at which the infrared energy emissions were detected. Computer 116 thus will have, in useful form, time-dependent data on the temperatures at locations 300 and 300a–300d, respectively.

As noted previously, because lower die mold 100 has a relatively massive thermal mass its temperature almost certainly will not show any significant time variations once steady-state operation of the equipment is obtained. The same, of course, will not be true of the temperatures determined for each of the lead frames 104, 104 placed on upper surface 102 of lower die mold 100. These lead frame temperatures "$T_f$" will each be time-dependent. However, because each of the lead frames has a relatively small thermal mass the temperatures of the various lead frames will rise quite quickly. It is intended that in the present invention the computer determine the time-varying temperature difference between the temperature of the lower die mold 100 (as determined at locations 300) and the respective temperatures at the various lead frame locations (detected at locations 300a–300d) respectively.

Through the use of a simple clock mechanism of known type, the above-described apparatus should permit computer 116 to very closely track the time-varying temperature differences as described above. The computer must then compare these time rates of change of temperature difference with predetermined reference values, to thereby determine whether the one or more lead frames is correctly positioned, whether more than one lead frame has been accidentally deposited at a particular location, or if a lead frame is entirely missing from its intended location. If more than one lead frame is deposited at a single location, then it will be the temperature of the uppermost one of these lead frames which will be determined by the correspondingly detected infrared energy emission. As will be readily appreciated, if two lead frames are deposited at the same location the uppermost one will experience a rise in temperature but this rise in temperature will be slower with respect to time than if only one lead frame had been deposited, simply as a consequence of the larger thermal mass absorbing energy at that location from lower die mold 100. Similarly, if a lead frame is entirely missing from its intended location then the temperature located by the corresponding optic probe should be the same as that of the lower die mold at location 300, i.e., the temperature difference will be virtually zero.

Obviously, each die mold will have its own thermal characteristics. Equally obviously, a competent user will therefore conduct preliminary tests of the entire system, including a specific lower die mold, a corresponding inloader head, and an assortment of correctly placed, incorrectly placed, two-in-one placed, or no lead frame at each of the intended locations. By such empirical procedures, the user should be able to develop information in the form of time rate of change of temperature difference (as described above) for each condition at each intended location for the various lead frames. Then, in use of this invention, collected data each time lead frames are deposited on the lower die mold 100 can, within seconds, be compared with the corresponding reference data to draw the necessary conclusions.

Figure 5:
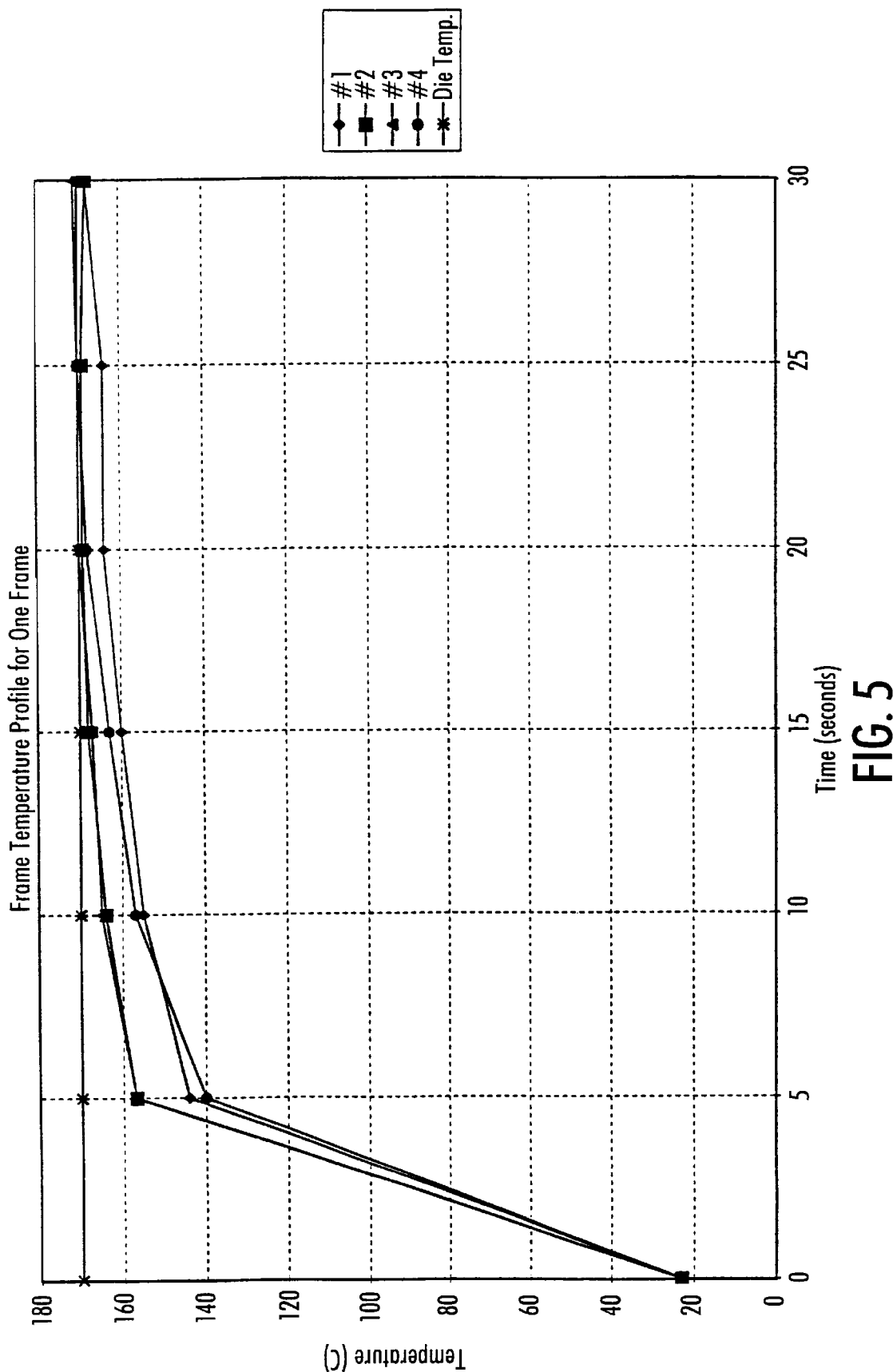
FIG. 5 is a set of temperature-time profiles for a single lead frame correctly positioned over a die mold.

FIG. 5 is a graphical plot showing a plurality of traces corresponding to a steady temperature of about 170° C. for the lower die mold and individual time-dependent temperature traces for each of four lead frames correctly placed thereon.

Figure 6:
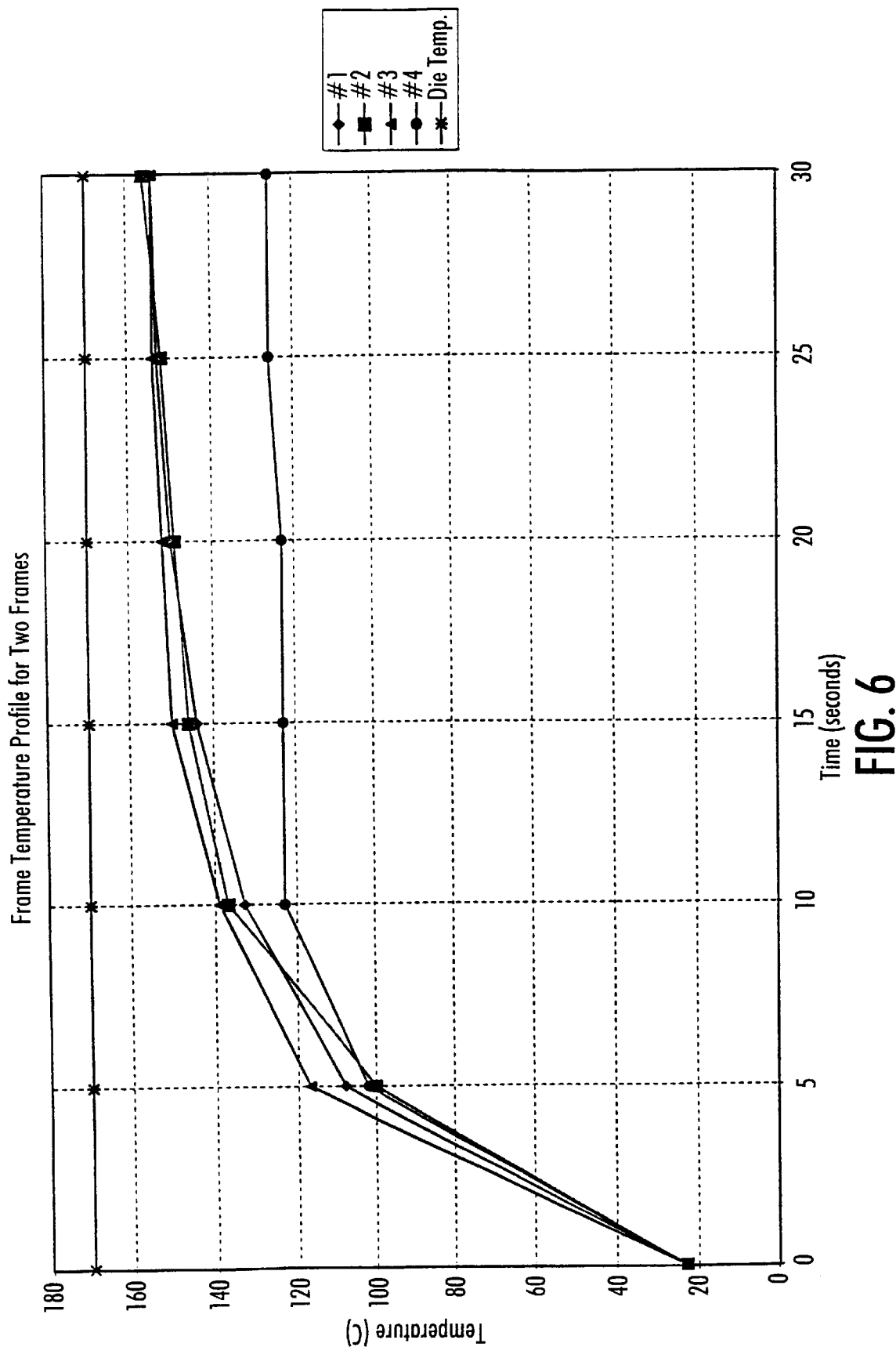
FIG. 6 is a set of temperature-time profiles for two lead frames correctly positioned over a die mold.

FIG. 6 is a similar set of graphical plots for a situation in which two lead frames are deposited one on top of each other at each of four locations. As will be readily apparent from a comparison of FIGS. 5 and 6, the time-dependent rate of change of the temperature difference between the die mold and the two-in-one-place lead frames is significantly lower than the corresponding time rate of change of temperature difference where there is only one lead frame at each intended location per FIG. 5.

Figure 7:
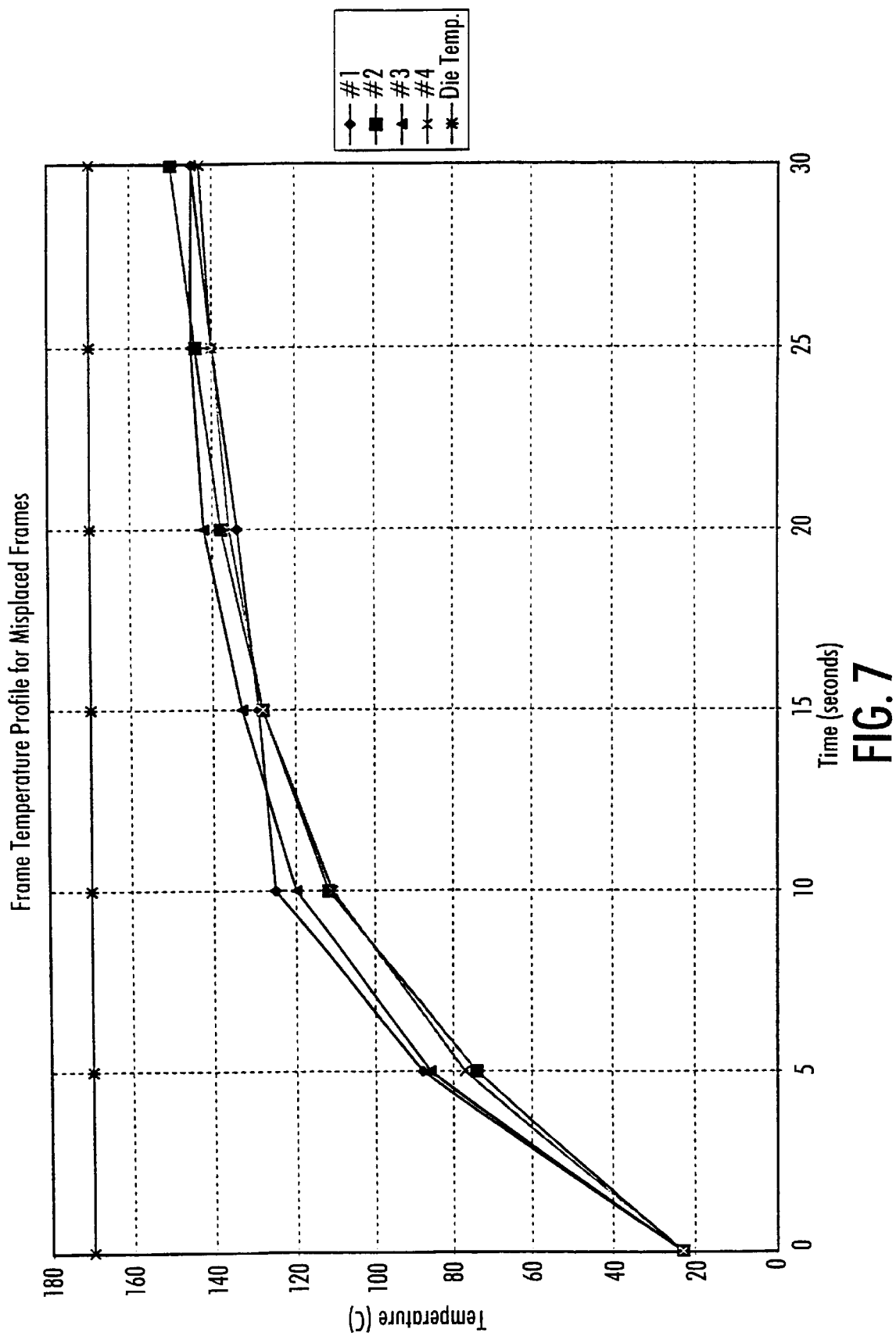
FIG. 7 is a set of temperature-time profiles for a misplaced lead frame correctly positioned over a die mold.

FIG. 7 is a similar set of graphical traces for a situation in which each of four lead frames is misplaced, e.g., translationally or rotationally out-of-position relative to each respective correct position. In this anomalous situation also, as in FIG. 6, it is clear that the time rate of change of temperature difference is considerably lower than is the case where the various lead frames are correctly positioned so as to generate the temperature traces per FIG. 5.

Figure 8:
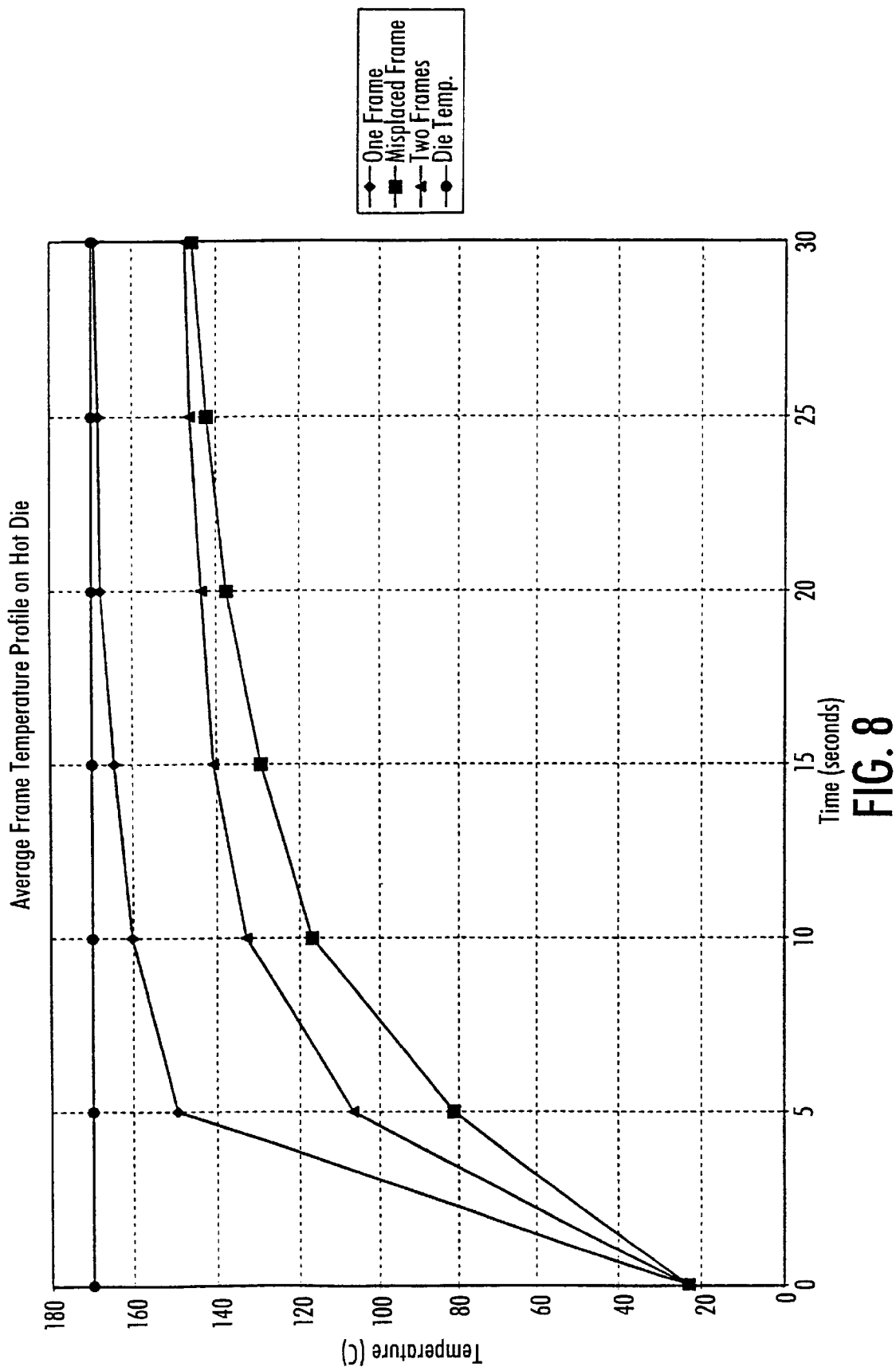
FIG. 8 is a set of temperature-time profiles, based on average values per data according to FIGS. 5, 6 and 7, to provide reference data for a single frame, a misplaced frame, two frames at a single location, and the die temperature, respectively.

Finally, FIG. 8 is a collection of graphical traces corresponding to the averages of the data contained in FIGS. 5, 6 and 7. Thus, in FIG. 8 there are shown four graphical traces respectively corresponding to: the lower die mold temperature (solid circular dots), a single lead frame in each position and correctly placed (solid diamond-shaped dots), a misplaced lead frame (solid square dots), and two lead frames at a particular location (solid triangular dots).

Referring back to FIG. 1, one can visualize the visible display of graphical traces 120 shown on visual monitor 118 as indicating to an operator a difference between an actual reading and the corresponding reference reading per the traces contained in FIG. 8. With experience, the user of such a system as taught by the present invention should be able to determine what is an acceptable tolerance or experimental error in making each set of determinations. Then, armed with this knowledge, the user can readily program computer 116 and connect it to suitable audio/visual warning devices of known type so that when an anomaly falls outside acceptable tolerances there will be an audio/visual indication. The audio signals may be chosen to be of different duration, different frequency, or the like to quickly advise the operator of the exact nature of the problem. Likewise, flashing red lights or the like may be employed to provide visual warning of any detected anomaly. Which type of warning system is utilized is a matter of design choice and is not considered critical to successful operation of the present invention for realization of its intended advantages.

As will be appreciated, provisions are made to correctly locate each lead frame at a corresponding location on the die mold. For efficiency and economy it is quite common to simultaneously so locate a number of lead frames at a time on a given die mold, for simultaneous processing thereat.

Conventionally, small pins 900 are provided at each such location to project upwardly from the die upper surface 102 of the die mold. See FIGS. 9(A), 9(B), 10(A) and 10(B). The pins 900 preferably are located in a selected pattern, e.g., a straight line, for convenience in placing/removing the lead frames 104 relative to the pins. Each lead frame 104 is provided with a corresponding array of small holes 902 that should receive respective pins when the lead frame is correctly placed, as best seen in FIGS. 9(A) and 9(B). If the lead frame 104 is not correctly positioned, e.g., it is laterally displaced relative to its intended correct location, it will actually sit on top of the pins, as best seen in FIGS. 10(A) and 10(B), and there will be a small gap "g" between the surface of the die mold 102 and the lowest surface of the misplaced lead frame 104 as determined by the heights of the pins 900. When the lead frame is correctly placed it will rest in substantial contact with the die mold. As will be readily appreciated, this will have a direct influence on how quickly the temperature difference between the lead frame and the die mold changes over time.

If a second lead frame 1100 is inadvertently placed on top of an already correctly placed lead frame 104, as best seen in FIGS. 11(A) and 11(B), there will be a gap between the second lead frame 1100 and the die mold beneath the now sandwiched-in-between lead frame 104. The infrared energy emission from the upper surface of the second lead frame 1100 will then naturally reflect this fact and the corresponding temperature difference between it and the die mold will be detected and interpreted to indicate an anomalous situation which the user can then correct.

When a number of lead frames are to be simultaneously and correctly located relative to their respective guide pins, any anomaly at any of the locations can be detected, the molding process stopped, and the error corrected.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. A method of determining whether a first element is located in a predetermined position in contact with a second clement which is initially at a temperature different from that of the first clement, the method comprising the steps of:

processing a first infrared energy emission from the first element into a first signal corresponding to a temperature of the first element;

processing a second infrared energy emission from the second element into a second signal corresponding to a temperature of the second element;

processing the first and second signals to determine therefrom a first value of a time rate of change of a temperature difference between the first and second elements; and comparing the determined first value to a predetermined second value indicative of correct location of the first element, to thereby decide whether the first clement is located in said predetermined position.

2. The method according to claim 1, wherein the step of processing the first infrared energy emission comprises the steps of:

locating a first fiber optic probe adjacent the first element, locating a second fiber optic probe adjacent the second element, and receiving the first and second infrared energy emissions into the first and second fiber optic probes respectively;

filtering the receiving first and second infrared energy emissions at a selected frequency; and converting the filtered first and second infrared energy emissions into first and second electrical signals respectively corresponding to the first and second temperatures.

3. The method according to claim 2, wherein the step of processing the first and second signals to determine the first value of the time rate of change of temperature difference comprises the further step of:

determining the temperature difference as a function of time for a period in the range 3–5 sec. after placement of the first element in contact with the second element.

4. A method of detecting the presence of at least one lead frame on a die mold surface which is initially at a temperature different from that of the at least one lead frame, the method comprising the steps of:

receiving a first infrared energy emission from the at least one lead frame;

receiving a second infrared energy emission from the die mold surface;

routing the received first and second infrared energy emissions independently of each other to filter the same in an interference filter;

quantifying the filtered first and second infrared energy emissions at a specific wavelength and generating respective first and second output signals corresponding to respective temperatures of the at least one lead frame and the die mold;

calculating a rate of change of the difference between the first and second temperatures based upon said first and second output signals; and comparing the calculated rate of change of temperature difference to a predetermined reference value to determine the presence of the at least one lead frame on the die mold.

5. The method according to claim 4, wherein:

the specific wavelength is determined by providing a selected silicon diode cooperating with the interference filter.

6. The method according to claim 4, wherein:

the first and second output signals are processed by a two-stage conditioning circuit which provides corresponding first and second low impedance amplified outputs.

7. The method according to claim 4, wherein:

the first and second infrared energy emissions are received by respectively positioned first and second fiber optic probes.

8. An apparatus for detecting a predetermined disposition of at least one lead frame on a die mold surface, comprising:

a plurality of fiber optic probes, corresponding to the number of lead frames, for detecting respective infrared energy emissions from each of the at least one lead frame;

a second fiber optic probe for detecting infrared energy emissions from the die mold;

an interference filter, cooperating with said plurality of fiber optic probes and said second fiber optic probe, for quantifying the detected infrared energy emissions at a specific wavelength; and a receiving circuit including:
an infrared detector,
an input circuit for receiving the quantified detected infrared energy emissions from the interference filters, and
an output circuit for generating output signals indicative of whether the at least one lead frame is in said predetermined disposition on the die mold surface.

9. The apparatus according to claim 8, further comprising:

a fiber optic bundle routing the infrared energy emissions from the fiber optic probes to the interference filter.

10. The apparatus according to claim 8, wherein:

at least one of the fiber optic probes is mounted on an inloader head located adjacent the at least one lead frame.

11. The apparatus according to claim 8, wherein:

the infrared detector comprises a silicon diode.

12. The apparatus according to claim 8, wherein:

the infrared detector output varies in correspondence with a temperature of a surface of the at least one lead frame and a temperature of the die mold.

13. The apparatus according to claim 8, further comprising:

a conditioning circuit amplifying the output from the infrared detector and generating a corresponding low impedance output; and an analog input circuit for receiving the low impedance output.

14. The apparatus according to claim 13, further comprising:

a computer coupled to said analog input circuit and configured to receive said output signals, generate an error signal, and terminate operation of the apparatus when a time rate of change of a temperature difference between a surface of the at least one lead frame and the die mold is outside a previously determined range.

15. A sensor apparatus for detecting a predetermined disposition of at least one lead frame on a die mold surface, comprising:

a respective fiber optic probe for each of the at least one lead frame and a surface of the die mold, each fiber optic probe being mounted on an inloader head located above the at least one lead frame and operatively coupled to a computer, detecting respective infrared energy emissions from the at least one lead frame and the die mold;

an interference filter quantifying all of the detected infrared energy emissions at a specific wavelength;

a silicon diode cooperating with the interference filter, generating outputs in correspondence with each of the quantified infrared energy emissions;

a conditioning circuit, amplifying the outputs from the silicon diode and providing corresponding low impedance outputs; and an analog input circuit receiving the low impedance outputs and operatively coupled to a computer to provide corresponding inputs thereto, wherein the computer is configured to terminate operation of the sensor apparatus when a time rate of change of a temperature difference between the at least one lead frame and the die mold is outside a previously determined range.

16. An apparatus for detecting each of a plurality of frames to ensure that there is only a single lead frame correctly disposed at each of a plurality of respective locations therefor on a die mold surface, comprising:

a plurality of optic fiber probes, corresponding to the number of lead frames, disposed for detecting infrared energy emissions from respective lead frames at said locations;

a second fiber optic probe disposed for detecting infrared energy emissions from the die mold;

an interference filter, cooperating with said plurality of fiber optic probes and said second fiber optic probe, for quantifying the infrared energy emissions detected; and a receiving circuit including:

an infrared detector, an input circuit for receiving the quantified detected infrared energy emissions from the interference filter, and an output circuit for generating output signals indicative of whether only one correctly disposed lead frame is present at each of said locations.

17. The apparatus according to claim 16, further comprising:

a fiber optic bundle routing the infrared energy emissions from the fiber optic probes to the interference filter.

18. The apparatus according to claim 16, wherein:

at least one of the fiber optic probes is mounted on an inloader head located adjacent the at least one lead frame.

19. The apparatus according to claim 16, wherein:

the infrared detector comprises a silicon diode.

20. The apparatus according to claim 16, wherein:

the infrared detector output varies in correspondence with a temperature of a surface of the at least one lead frame and a temperature of the die mold.

21. The apparatus according to claim 20, further comprising:

a computer coupled to said analog input circuit and configured to receive said output signals, generate an error signal, and terminate operation of the apparatus when a time rate of chance of a temperature difference between a surface of the at least one lead frame and the die mold is outside a previously determined range.

22. The apparatus according to claim 16, further comprising:

a conditioning circuit amplifying the output from the infrared detector and generating a corresponding low impedance output; and an analog input circuit receiving the low impedance output.

\* \* \* \* \*